(12) United States Patent
Tomita

(10) Patent No.: US 6,278,190 B1
(45) Date of Patent: Aug. 21, 2001

(54) SEMICONDUCTOR DEVICE

(75) Inventor: Yoshihiro Tomita, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/360,694

(22) Filed: Jul. 26, 1999

(30) Foreign Application Priority Data

Mar. 4, 1999 (JP) .................................................. 11-056779

(51) Int. Cl.$^7$ ........................... H01L 23/48; H01L 23/52; H01L 29/40
(52) U.S. Cl. ........................ 257/777; 257/778; 257/783; 257/723; 257/781; 257/702; 257/730; 257/680; 257/787
(58) Field of Search ..................................... 257/777–788, 257/781–783, 702, 730, 680, 686, 723, 787

(56) References Cited

U.S. PATENT DOCUMENTS

| | | | |
|---|---|---|---|
| 5,604,379 | * 2/1997 | Mori ...................................... | 257/738 |
| 5,608,262 | * 3/1997 | Degani et al. ........................ | 257/723 |
| 5,790,384 | * 8/1998 | Ahmad et al. ........................ | 361/760 |
| 5,808,878 | * 9/1998 | Saito et al. ............................ | 361/818 |
| 5,869,894 | * 2/1999 | Degani et al. ........................ | 257/723 |
| 5,918,113 | * 6/1999 | Higashi et al. ....................... | 438/119 |
| 5,977,640 | * 11/1999 | Bertin et al. .......................... | 257/777 |
| 6,144,507 | * 11/2000 | Hashimoto ........................... | 359/819 |

FOREIGN PATENT DOCUMENTS

| | | |
|---|---|---|
| 5-74774 | 3/1993 | (JP) . |
| 10-242381 | 9/1998 | (JP) . |

* cited by examiner

Primary Examiner—Steven Loke
Assistant Examiner—Nitin Parekh
(74) Attorney, Agent, or Firm—McDermott, Will & Emery

(57) ABSTRACT

A semiconductor device includes semiconductor elements 1 and 2 which are connected through a conductor 40. The wiring layer 24 of the first semiconductor element 1 is externally extended through a small hole 26 formed on a wiring board 23 and filled with a conductive material, a wiring layer 25 of the second semiconductor element 2 and an external connecting terminal 27. The portion connecting the semiconductor elements exclusive of the back surfaces thereof are sealed by sealing material 28. In this configuration, the semiconductor device can be provided which includes semiconductor elements multi-layered to give advantages of low-profiling, compactness, high dissipation and low cost.

13 Claims, 4 Drawing Sheets

SEMICONDUCTOR DEVICE

BACKGROUND OF THE INVENTION

1. Field of the Invention

The present invention relates to a semiconductor device with semiconductor elements multilayered.

2. Description of the Related Art

FIG. 5 is a sectional view of a conventional semiconductor device with semiconductor elements multilayered, as described in e.g. JP-A-10-242,381. In FIG. 5, reference numerals 1 and 2 denote a semiconductor element, respectively, and reference numeral 3 denotes one of bumps formed on the semiconductor element 1. The semiconductor element 1 is electrically connected to the semiconductor element 2 through an adhesive layer containing conductive particles. The adhesive layer 4 is a single layer of a single material. The adhesive layer 4 is connected to external leads 5 each of which is shaped in a Gull-Wing to constitute an external terminal. Reference numeral 6 denotes sealing resin which forms an external shape sealing the entire periphery of the semiconductor elements 1 and 2 and a connecting portion between them and the external leads 5. In this way, a semiconductor device with the plurality of semiconductor elements is constituted.

Now referring to FIGS. 6A and 6B, an explanation will be given of the function of the adhesive layer 4 containing the conductive particles. FIG. 6A is a view before the semiconductor elements 1 and 2 are bonded, and FIG. 6B is a view after they are bonded. Reference numeral 8 denotes one of conductive particles scattered in the adhesive layer 4. The adhesive layer 4 is essentially an insulator. However, as shown in FIG. 6B, the bump 3 provided on the semiconductor element 1 is pressed against the adhesive layer 4 so that the conductive particles 8 are brought into contact with each other between the bump 3 and the electrode 7 formed on the semiconductor element 2. Thus, electrical conduction is established between the bump 3 and the electrode 7.

The conventional semiconductor device with a plurality of semiconductor elements multi-layered has a problem that because its entirety is sealed, the package is difficult to be low-profiled and cannot provide high heat dissipation. In addition, the semiconductor device is difficult to be miniaturized because the leads constitute external terminals. Further, since the external terminal is extended through the single adhesive material, it cannot give a high degree of electric freedom where both semiconductor elements 1 and 2 are active elements. Moreover, since the bumps must be formed, it is difficult to manufacture the semiconductor device at low cost.

SUMMARY OF THE INVENTION

An object of the present invention is to provide a semiconductor device with semiconductor elements multi-layered which has advantages of low-profiling, compactness, high dissipation and low cost.

A first aspect of the device is a semiconductor device of the present invention, which comprises: a first semiconductor element having a first circuit plane formed on its surface; a second semiconductor element having a second circuit plane formed oppositely to said first circuit plane and electrically connected to said first semiconductor element within said second circuit plane; a wiring portion surrounding said second semiconductor element and having an external connecting terminal electrically connected to said first semiconductor element; and a sealing material constituting a connecting portion except the back surfaces of said first and second semiconductor elements.

A second aspect of the device is a semiconductor device according to the first aspect, wherein said wiring portion is a frame-like wiring board having an inner periphery more outward than the outer periphery of said second semiconductor element and an outer periphery more inward than the outer periphery of said first semiconductor element.

A third aspect of the device is a semiconductor device according to the first aspect, wherein said wiring portion is a film carrier fixed to the surface of the edge of said first semiconductor element and having a wiring pattern.

A fourth aspect of the device is a semiconductor device according to the third aspect, wherein said sealing material is resin integrally resin-sealing the outsides of said first and second semiconductor elements and a part of said wiring board.

A fifth aspect of the device is a semiconductor device according to the second aspect, wherein said outer connecting terminal is formed in a columnar shape and made of a material not melting in packaging.

A sixth aspect of the device is a semiconductor device according to the second aspect, wherein said outer connecting terminal is formed in a bump or ball shape.

A seventh aspect of the device is a semiconductor device according to the sixth aspect, wherein said outer connecting terminal is a solder ball formed in a through-hole formed so as to expose a portion of a circuit pattern formed on said wiring board.

An eighth aspect of the device is a semiconductor device according to the first aspect, wherein either one of said first semiconductor element and said second semiconductor element has a solder ball for connection and said first and said second semiconductor element are connected through said solder ball.

A ninth aspect of the device is a semiconductor device according to the first aspect, wherein either one of said first semiconductor element and said second semiconductor element has a columnar conductor for connection and are electrically connected to each other through said columnar conductor whereas the periphery of said columnar conductor is sealed by insulating resin.

A tenth aspect of the device is a semiconductor device according to the first aspect, wherein either one of said first semiconductor element and said second semiconductor element has a columnar conductor for connection and are electrically connected to each other through said columnar conductor whereas the periphery of said columnar conductor is sealed by inorganic insulating material.

An eleventh aspect of the device is a semiconductor device according to the first aspect, wherein said first and said second semiconductor element are connected to each other by an anisotropic conductive film.

A twelfth aspect of the device is a semiconductor device according to the first aspect, wherein said semiconductor element consists of plural elements.

A thirteenth aspect of the method is a method of semiconductor device of the present invention, which comprises the steps of: preparing a first semiconductor element having a first circuit plane on its surface; preparing a second semiconductor element having a second circuit plane on its surface and having a smaller size-than that of said first semiconductor element; preparing a wiring board arranged on the periphery of said second semiconductor element and having an external connecting terminal; fixing said first semiconductor element to said wiring board to make an eclectic connection; fixing said second semiconductor element on said first semiconductor element to make an electric connection so that the first and second circuit planes are opposite and electrically connected to each other; and resin-sealing at least the outsides of said first and said second semiconductor element.

In this configuration, a sealing structure with the back of semiconductor elements exposed realizes low-profiling and high heat dissipation. The wiring board and external connecting terminals which are formed facially or circumferentially are adopted, but the lead terminals are not adopted. For this reason, the external shape of the semiconductor device can be easily small-sized. The wiring plate is used and the conductive layer is provided individually on the semiconductor element. This enhances the degree of freedom of wiring.

In accordance with the another aspect of the present invention, preferably, the external connecting terminal is formed in a columnar shape and made of a material not melting in packaging. Therefore, the influence of the thermal stress between the material constituting the semiconductor device and a printed board can be relaxed.

The external connecting terminal can be formed in a bump or ball shape. According the structure, the semiconductor device can be further low-profiled.

The above and other objects and features of the present invention will be more apparent from the following description taken in conjunction with the accompanying drawings.

DESCRIPTION OF THE PREFERRED EMBODIMENTS

Embodiment 1

Figure 1:
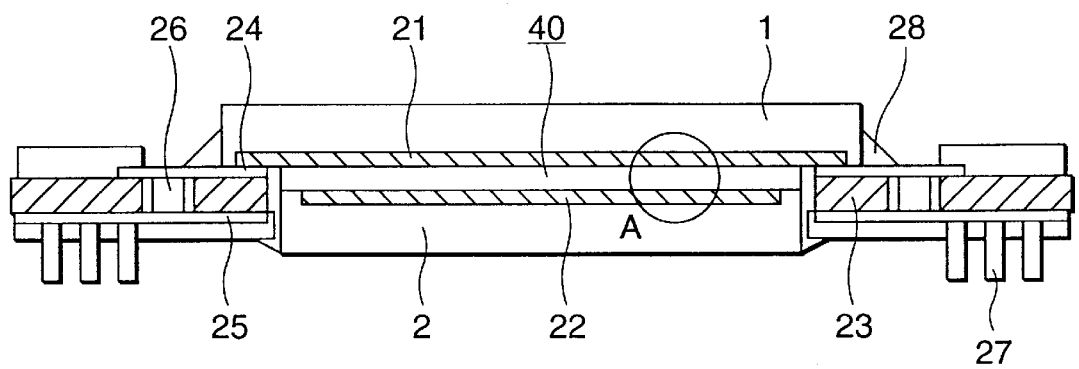
FIG. 1 is a sectional view of a semiconductor device according to a first embodiment of the present invention.

FIG. 1 is a sectional view showing a semiconductor device according to the first embodiment of the present invention. In FIG. 1, reference numeral 1 denotes a first semiconductor element; 2 a second semiconductor element; 21, 22 a circuit plane formed on the main surface of each of the semiconductor elements 1 and 2, respectively; and 40 a conductive layer which is electrically connected to these circuit surfaces 21 and 22. The conductive layer 40 is formed within the area of the semiconductor element 2. The structure of the conductive layer 40 of the semiconductor element 2 will be described later. Reference numeral 23 denotes a wiring board; 24, 25 a wiring layer, respectively; 26 a small hole which passes through the wiring board 23 and electrically connects the wiring layers 24 and 25. The small hole is filled with a conductive material.

Reference numeral 27 denotes one of external connecting terminals which are formed facially or circumferentially on the wiring layer 25. In this embodiment, the connecting terminal 27 is formed in a columnar shape. Particularly, where the material of the semiconductor device may be influenced by the thermal stress between itself and a printed board, the external connecting terminal 27 is preferably made of a material such as copper alloy which is not molten by the temperature in packaging. Reference numeral 28 denotes a sealing material which seals the connecting portion except the back surfaces of the semiconductor elements 1 and 2.

The wiring layer 24 is electrically connected to the circuit surface of the first semiconductor element 1 so that it is electrically connected to the circuit surface 22 of the second semiconductor element 2 through the conductor layer 40. The wiring layer 24 is electrically connected to the wiring layer 25 and external connecting terminal 27 through a conductive material filled in the small hole 26 and is extended externally.

Figure 2:
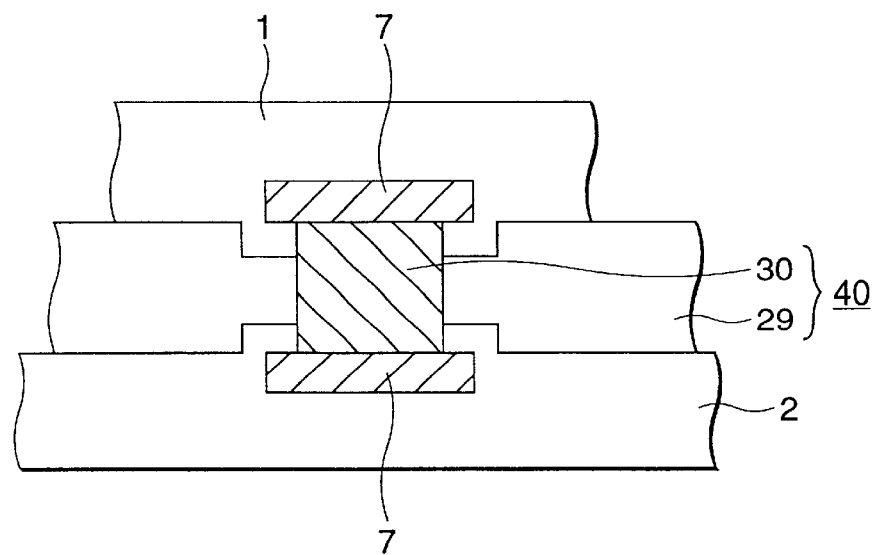
FIG. 2 is a partial sectional view of area A in FIG. 1.

An explanation will be given of the structure of the conductive layer 40. FIG. 2 is a partially enlarged view of area A in FIG. 1. In FIG. 2, reference numeral 7 denotes an electrode; 29 an insulator of resin; and 30 a metallic conductor. The insulator 29 and metallic conductor 30 constitute the conductive layer 40. In this way, conduction between the semiconductor elements is implemented by the metallic conductor 30, and the periphery of the metallic conductor 30 is electrically insulated by the resin 29. In this case, the metallic conductor 30 may contain an organic material containing metallic particles. The insulator 29 may be an inorganic material. Since the semiconductor device according to the first embodiment of the present invention is structured as described above, it can be low-profiled and miniaturized and manufactured as compared with the conventional semiconductor device. The main features thereof are as follows.

(1) A sealing structure with the back surface of the semiconductor element exposed realizes low-profiling and high heat dissipation of the semiconductor device.

(2) The wiring board and external connecting terminals which are formed facially or circumferentially are adopted, but the lead terminals are not adopted. For this reason, the external shape of the semiconductor device can be easily small-sized.

(3) The wiring board is used and the conductive layer is provided individually on the semiconductor element. This enhances the degree of freedom of wiring.

(4) The wiring board is used, the shape of the external terminal inclusive of a pin-shape, bump-shape and ball shape which does not melt in packaging, or material which melts in packaging can be freely selected.

In the first embodiment, although two (front and back) wiring layers were adopted, either single layer may be adopted. The small holes for making conduction between the front and back wiring layers may not be provided. This also provides the same effect.

The semiconductor device according to this embodiment can be combined with elements such as a resistor and a capacitor, thereby providing the high degree of freedom of design.

Embodiment 2

Figure 3:
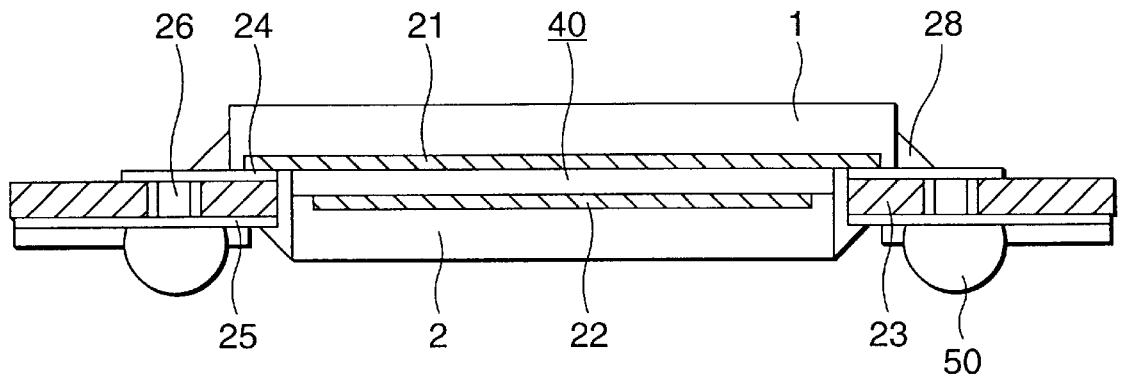
FIG. 3 is a sectional view of a semiconductor device according to a second embodiment of the present invention.

FIG. 3 is a sectional view of a semiconductor device according to the second embodiment of the present invention. In FIG. 3, reference numeral 50 denotes an external connecting terminal formed in a ball or bump shape. In this embodiment, the external connecting terminal 50 is made of the material which melts in packaging, and hence can be further low-profiled in packaging.

Embodiment 3

Figure 4:
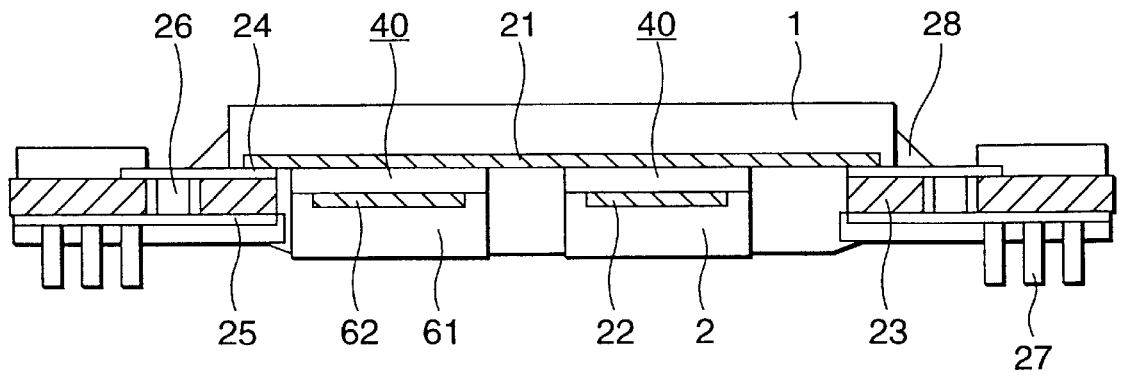
FIG. 4 is a sectional view of a semiconductor device according to a third embodiment of the present invention.
Figure 5:
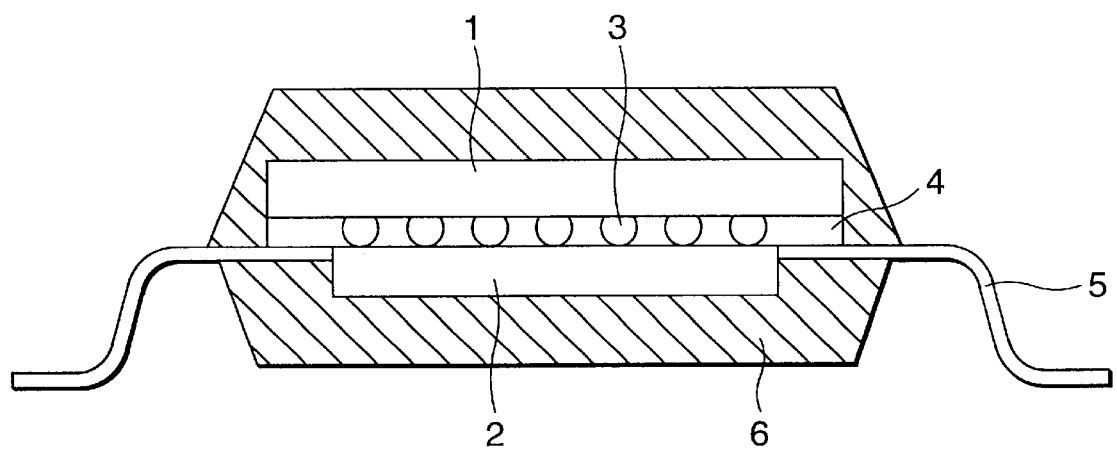
FIG. 5 is a sectional view of a conventional semiconductor with semiconductor elements multi-layered.
Figure 6A:
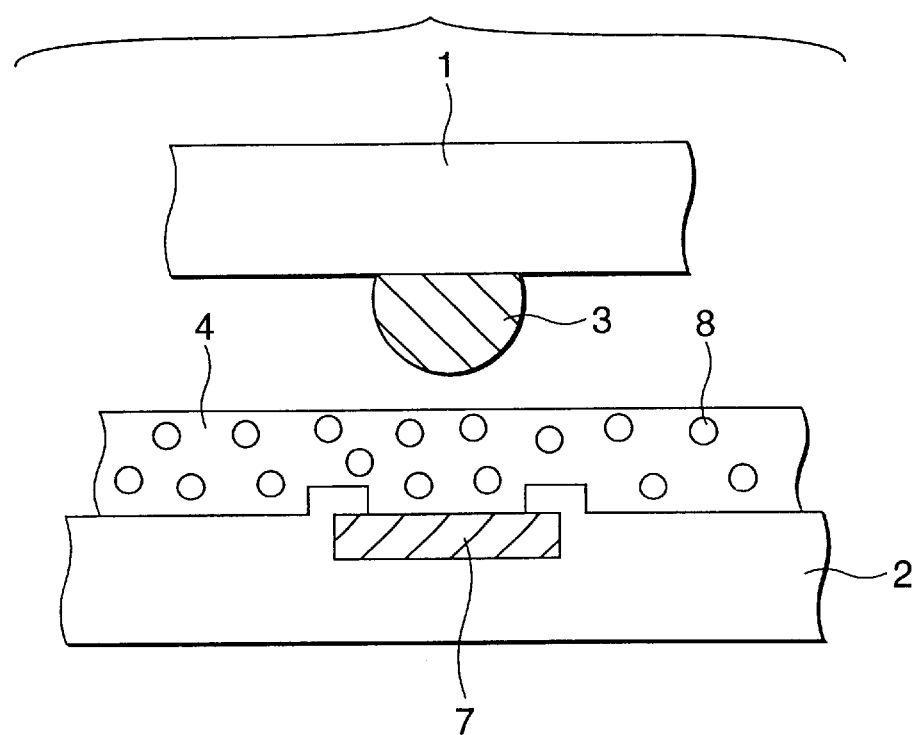
FIG. 6A and FIG. 6B are views for explaining the function of an adhesive layer 4 containing conductive particles.
Figure 6B:
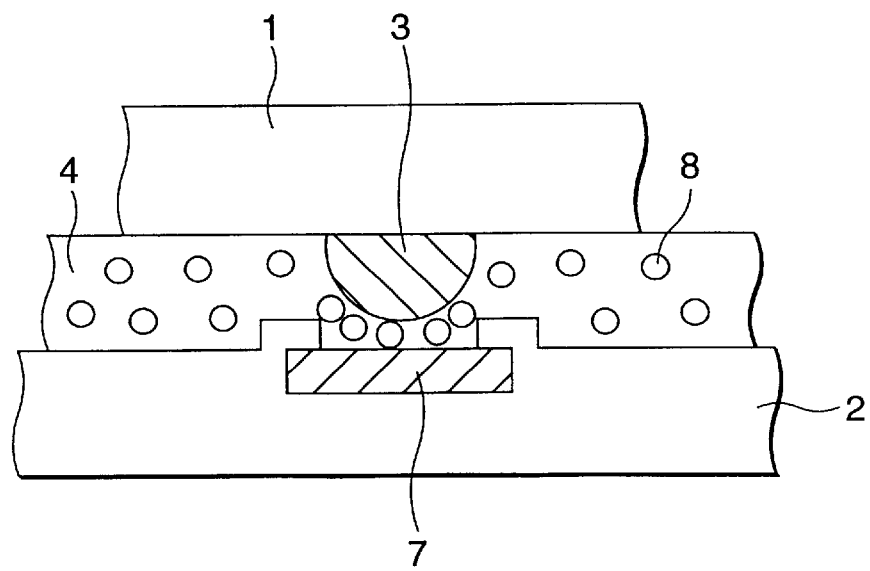

FIG. 4 is a sectional view of a semiconductor device according to the third embodiment of the present invention.

In FIG. 4, reference numeral 61 denotes a third semiconductor element, and reference numeral 62 denotes a circuit plane formed on the third semiconductor element. Like the second semiconductor element 2, the third semiconductor element 61 is electrically connected to the circuit plane of the first semiconductor element 1 through the conducting layer 40. In this way, in this embodiment, a plurality of semiconductor elements can be combined.

What is claimed is:

1. A semiconductor device comprising:
    a first semiconductor element having a first circuit plane formed on its surface;
    a second semiconductor element having a second circuit plane formed oppositely to said first circuit plane and electrically connected to said first semiconductor element within said second circuit plane;
    a wiring portion surrounding of said second semiconductor element and having an external connecting terminal electrically connected to said first semiconductor element; and
    a sealing material constituting a connecting portion except the back surfaces of said first and second semiconductor elements, wherein said wiring portion is frame-like wiring board having an inner periphery more outward than the outer periphery of said second semiconductor element and more inward than the outer periphery of said first semiconductor element.

2. A semiconductor device according to claim 1, wherein said wiring portion is a film carrier fixed to the surface of the edge of said first semiconductor element and having a wiring pattern.

3. A semiconductor device according to claim 2, wherein said sealing material is resin integrally resin-sealing the outsides of said first and second semiconductor elements and a part of said wiring board.

4. A semiconductor device according to claim 1, wherein said outer connecting terminal is formed in a columnar shape and made of a material not melting in packaging.

5. A semiconductor device according to claim 1, wherein said outer connecting terminal is formed in a bump or ball shape.

6. A semiconductor device according to claim 5, wherein said outer connecting terminal is a solder ball formed in a through-hole formed so as to expose a portion of a circuit pattern formed on said wiring board.

7. A semiconductor device according to claim 1, wherein either one of said first semiconductor element and said second semiconductor element has a solder ball for connection and said first and said second semi conductor element are connected through said solder ball.

8. A semiconductor device according to claim 1, wherein said semiconductor element consists of plural elements.

9. A semiconductor device according to claim 1, comprising the steps of:
    preparing a first semiconductor element having a first circuit plane on its surface;
    preparing a second semiconductor element having a second circuit plane on its surface and having a smaller size than that of said first semiconductor element;
    preparing a wiring board arranged on the periphery of said second semiconductor element and having an external connecting terminal;
    fixing said first semiconductor element to said wiring board to make an electrical connection;
    fixing said second semiconductor element on said first semiconductor element to make an electric connection so that the first and second circuit planes are opposite and electrically connected to each other; and
    resin-sealing at least the outsides of said first and said second semiconductor element.

10. A semiconductor device according to claim 1, wherein the sealing material is formed so that the back surfaces of said first and second semiconductor elements are exposed.

11. A semiconductor device comprising:
    a first semiconductor element having a first circuit plane formed on its surface;
    a second semiconductor element having a second circuit plane formed oppositely to said first circuit plane and electrically connected to said first semiconductor element within said second circuit plane;
    a wiring portion surrounding of said second semiconductor element and having an external connecting terminal electrically connected to said first semiconductor element; and
    a sealing material constituting a connecting portion except the back surfaces of said first and second semiconductor elements, wherein either one of said first semiconductor element and said second semiconductor element has a columnar conductor for connection and are electrically connected to each other through said columnar conductor whereas the periphery of said columnar conductor is sealed by insulating resin.

12. A semiconductor device comprising:
    a first semiconductor element having a first circuit plane formed on its surface;
    a second semiconductor element having a second circuit plane formed oppositely to said first circuit plane and electrically connected to said first semiconductor element within said second circuit plane;
    a wiring portion surrounding of said second semiconductor element and having an external connecting terminal electrically connected to said first semiconductor element; and
    a sealing material constituting a connecting portion except the back surfaces of said first and second semiconductor elements, wherein either one of said first semiconductor element and said second semiconductor element has a columnar conductor for connection and are electrically connected to each other through said columnar conductor whereas the periphery of said columnar conductor is sealed by inorganic insulating material.

13. A semiconductor device comprising:
    a first semiconductor element having a first circuit plane formed on its surface;
    a second semiconductor element having a second circuit plane formed oppositely to said first circuit plane and electrically connected to said first semiconductor element within said second circuit plane;
    a wiring portion surrounding of said second semiconductor element and having an external connecting terminal electrically connected to said first semiconductor element; and
    a sealing material constituting a connecting portion except the back surfaces of said first and second semiconductor elements, wherein said first and said second semiconductor element are connected to each other by an anisotropic conductive film.

* * * * *